United States Patent [19]

Nam

[11] Patent Number: 5,863,344
[45] Date of Patent: Jan. 26, 1999

[54] CLEANING SOLUTIONS FOR SEMICONDUCTOR DEVICES

[75] Inventor: Jae-woo Nam, Kyungki-do, Rep. of Korea

[73] Assignee: Samsung Electronics Co., Ltd., Suwon, Rep. of Korea

[21] Appl. No.: 766,809

[22] Filed: Dec. 13, 1996

[30] Foreign Application Priority Data

Dec. 20, 1995 [KR] Rep. of Korea .................. 1995 52704

[51] Int. Cl.⁶ .................................................. H01L 21/302
[52] U.S. Cl. ........................... 134/1.3; 438/755; 438/756
[58] Field of Search ............................ 134/1.3; 252/79.1, 252/79.2, 79.5; 438/754, 755, 756

[56] References Cited

U.S. PATENT DOCUMENTS 4,039,371  8/1977  Brunner et al. ......................... 156/668
5,320,707  6/1994  Kanekiyo et al. ....................... 156/665
5,466,389  11/1995  Ilardi et al. .............................. 252/156
5,595,927  1/1997  Chen et al. ................................ 437/52

FOREIGN PATENT DOCUMENTS 06275723  9/1994  Japan .
975831  11/1982  U.S.S.R. .

*Primary Examiner*—Benjamin Utech
*Assistant Examiner*—George Goudreau
*Attorney, Agent, or Firm*—Myers Bigel Sibley & Sajovec, P.A.

[57] ABSTRACT

Cleaning solutions for semiconductor devices comprise tetramethyl ammonium hydroxide, acetic acid, and water. Methods of removing contaminants from semiconductor devices comprise contacting the semiconductor devices with cleaning solutions to remove the contaminants from the semiconductor devices.

6 Claims, 5 Drawing Sheets

CLEANING SOLUTIONS FOR SEMICONDUCTOR DEVICES

FIELD OF THE INVENTION

The present invention relates to solutions useful for cleaning semiconductor devices. More particularly, the invention relates to solutions useful for cleaning impurities from semiconductor devices produced as by-products during the formation of metal wiring layers.

BACKGROUND OF THE INVENTION

The increase in integration density of semiconductor devices, along with the miniaturization of circuit patterns has resulted in heightened levels of impurities being present on the devices. Such impurities include, for example, metals, polymers, and particles. The impurities often adversely affect the yield and reliability of products containing the semiconductor devices. Accordingly, cleaning the semiconductor devices has become increasingly important in semiconductor manufacturing processes.

In fabricating semiconductor devices, aluminum is generally used as a wiring material and serves to connect the devices. During the annealing process, the deposited aluminum often reacts with the underlying silicon layer. Specifically, when pure aluminum is employed in the above process, the junction between the aluminum and the silicon is typically destroyed due primarily to the presence of a spike at their contact surface. As a result, the semiconductor device often experiences failure.

In attempting to address the above problem, aluminum alloys containing a predetermined amount of copper, silicon, and the like are used as a wiring material. Subsequent to etching such an aluminum alloy layer, the aluminum is usually removed by an etch solution. The copper and silicon typically remain however, and may react with components of the etch solution. As a result, impurities are often produced.

A metal layer may be etched using a conventional etch gas and a photoresist pattern. In such a process, polymer contaminants are often produced by a reaction between the etch gas, the photoresist, and the metal layer. Since the presence of the polymer contaminants may greatly increase contact resistance between metal patterns, it is typically necessary to remove the polymer contaminants by applying a cleaning solution. Conventional cleaning solutions typically contain an amine compound such as aminoethyl piperidine, isopropylamine, hydroxyethyl morpholine, aminoalcohol, and diethylenetriamine; and a solvent such as N-methyl-2-pyrrolidone, dimethyl sulfoxide, N,N-dimethylacetamide, and N, N-dimethylformamide.

Although these cleaning solutions have the potential to remove the polymer contaminants, the use of the solutions often results in local corrosion of metal layers. As a result, wiring reliability may be adversely affected. Therefore, there remains a need in the art for cleaning solutions which successfully remove various impurities with minimal local corrosion of metal layers.

SUMMARY OF THE INVENTION

In view of the above, it is an object of the present invention to provide cleaning solutions useful for removing impurities such as particles or polymer contaminants from semiconductor devices while minimizing damage to metal layers of the devices.

It is a further object of the present invention to provide methods for removing impurities using the above cleaning solutions.

These and other objects, features, and advantages are provided by the cleaning solutions of the present invention. In particular, the cleaning solutions comprise tetramethyl ammonium hydroxide, acetic acid, and water. Preferably, deionized water is used in the cleaning solutions.

The cleaning solution components may be used in various amounts. In one embodiment, the concentration of the acetic acid is at least 99.9 percent based on the weight of the cleaning solution. In another embodiment, the concentration of the tetramethyl ammonium hydroxide ranges from about 1 to about 30 percent based on the weight of the cleaning solution.

The components may also be employed in various volume ratios. For example, the volume ratio of acetic acid to tetramethyl ammonium hydroxide may range from about 1 to about 50. Moreover, the volume ratio of water to tetraethyl ammonium hydroxide may range from about 1 to about 50.

The invention also provides methods for removing impurities from semiconductor devices. The methods comprise treating the semiconductor devices with the above cleaning solutions to remove impurities from the semiconductor devices.

BRIEF DESCRIPTION OF THE DRAWINGS

In the accompanying drawings which form a portion of the original disclosure.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

The present invention relates to cleaning solutions for semiconductor devices. The cleaning solutions comprise tetramethyl ammonium hydroxide, acetic acid, and water.

Deionized water is preferably used for the purposes of the invention. It is also preferred that the cleaning solutions include solutions of tetramethyl ammonium hydroxide.

The components in the cleaning solutions may be used in various amounts. For example, the concentrations of acetic acid may be at least about 99.9 percent based on the weights of the cleaning solutions. The concentrations of tetramethyl ammonium hydroxide can range from about 1 to about 30 percent based on the weights of the cleaning solutions.

The volume ratios of acetic acid to tetramethyl ammonium hydroxide preferably range from about 1 to about 50. The volume ratios of water to tetramethyl ammonium hydroxide preferably range from about 1 to about 50.

The invention also relates to methods for removing impurities from semiconductor devices. The methods include contacting the semiconductor devices with the cleaning solutions to remove the impurities from the semiconductor devices. The cleaning solutions include those described herein.

The term "impurities" is to be broadly construed and includes, but is not limited to, particles which result from the formation of metal wiring layers on the semiconductor devices, polymer contaminants produced as a result of etching metal layers in semiconductor devices, and the like.

The examples are set forth to illustrate the present invention, and are not to be construed as limiting thereof.

EXAMPLE 1

In order to estimate the particle removing effect of the cleaning solution of the present invention, at least 1000 particles were artificially produced on a semiconductor substrate. The semiconductor substrate was then submerged into a cleaning solution which contained 2.38 weight percent of tetramethyl ammonium hydroxide solution, acetic acid, and deionized water. The substrate was treated for a predetermined time, and was then examined by a surfscan sold by the Tencor Co.

Figure 1:
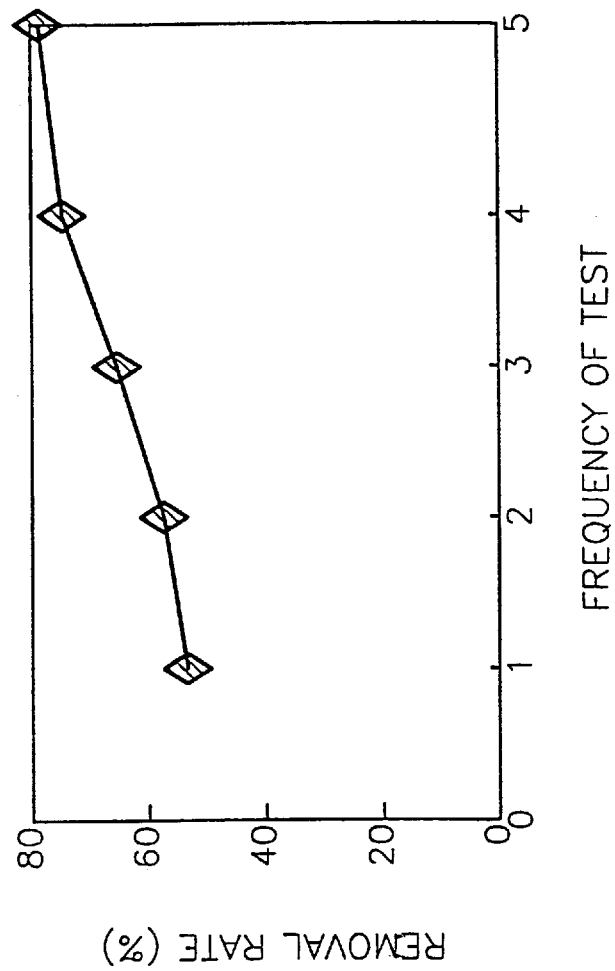
FIG. 1 is a graph illustrating particle removing rate versus frequency of cleaning operations using cleaning solutions of the present invention.

FIG. 1 is a graph showing the particle removing rate according to the frequency of cleaning operations using the above cleaning solution. As shown, the cleaning solution advantageously removes a large percentage of the particles present on the semiconductor substrate.

EXAMPLE 2

To estimate the effect of removing polymer contaminants produced as a result of metal layer etching, a semiconductor substrate containing polymer contaminants was submerged into a cleaning solution, cleaned for a predetermined period of time, and then examined by an SEM.

Figure 2A:
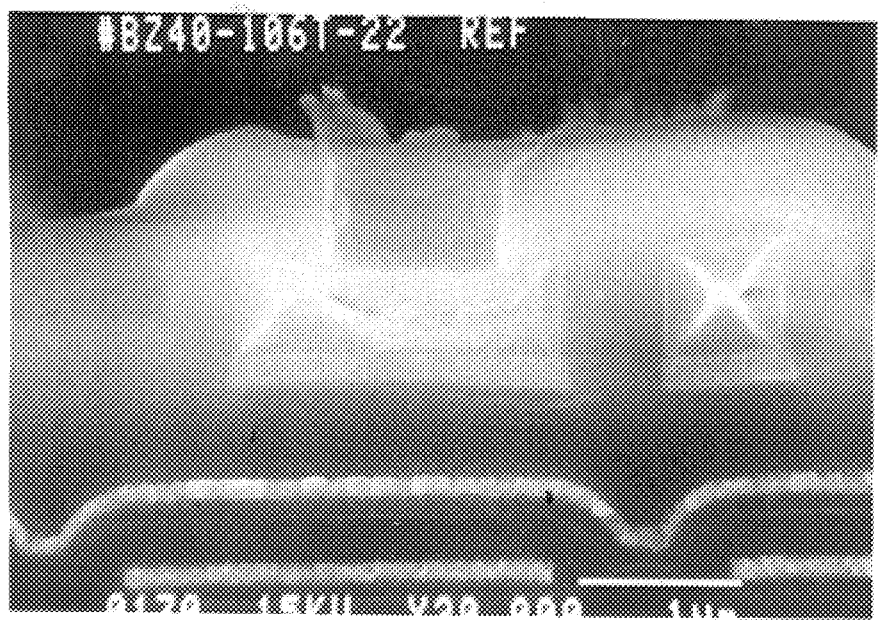
FIGS. 2A and 2B are SEM photographs illustrating side and front views of a via hole contaminated by polymer contaminants before cleaning.
Figure 2B:
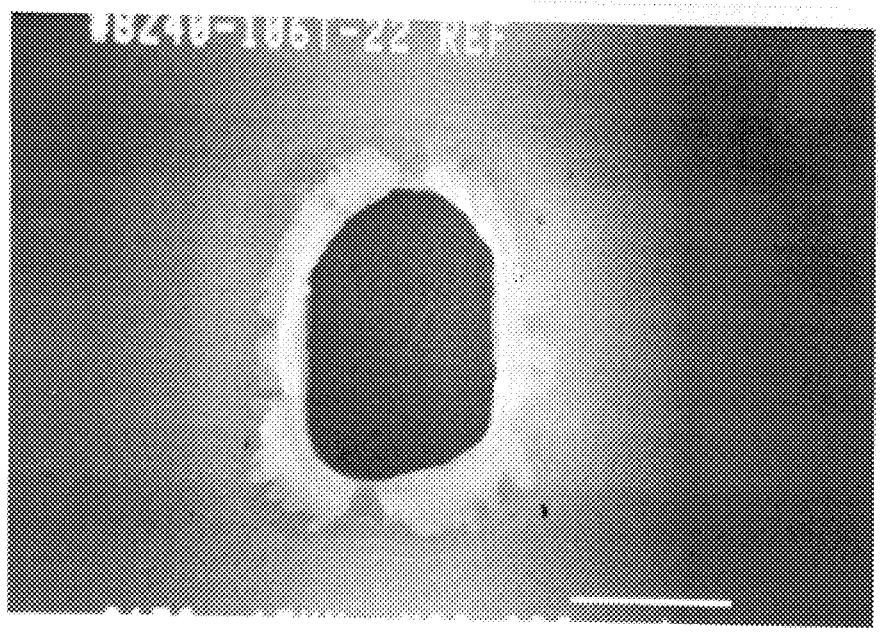
Figure 2C:
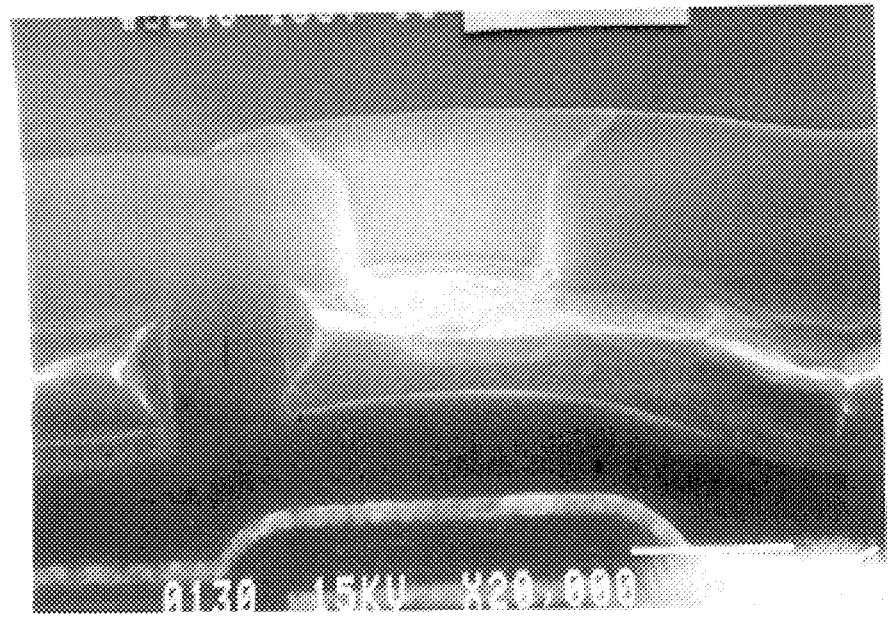
FIGS. 2C and 2D are SEM photographs illustrating side and front views of a via hole after polymer contaminants are removed using the cleaning solutions of the present invention.
Figure 2D:
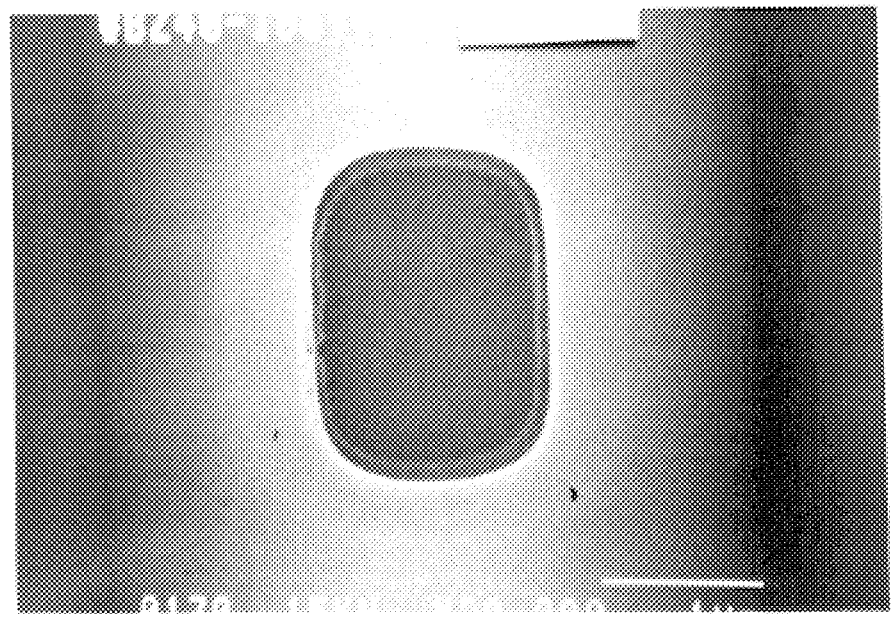

FIGS. 2A–2D are SEM photos showing the effects of the cleaning solution of the present invention on cleaning a via hole contaminated with the polymer contaminants. Specifically, FIGS. 2A and 2B illustrate side and front views of the via hole respectively which is contaminated with the polymer contaminants prior to cleaning, while FIGS. 2C and 2D illustrate side and front views of the via hole respectively after cleaning using a cleaning solution of the present invention. As shown in the figures, the cleaning solution of the present invention effectively removed the polymer contaminants from the semiconductor substrate.

EXAMPLE 3

Figure 3A:
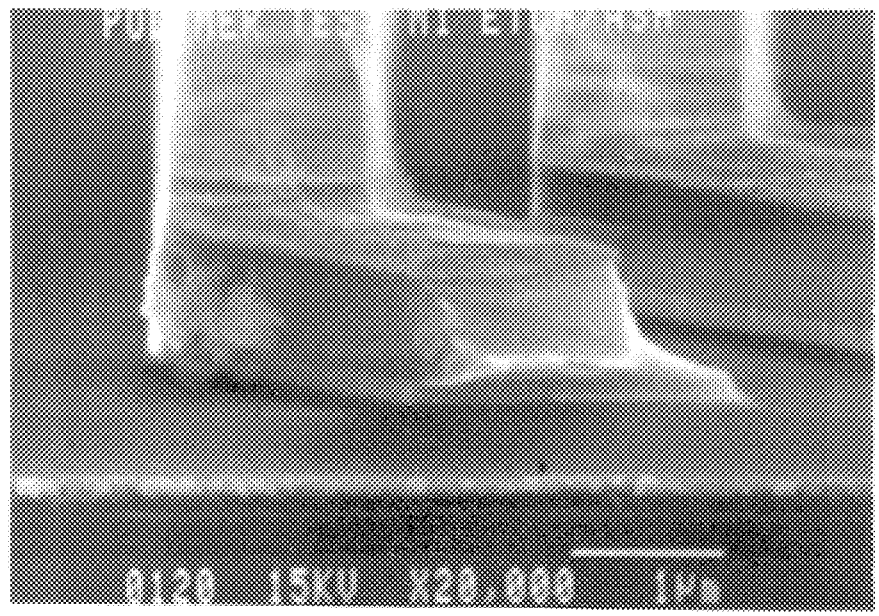
FIG. 3A is an SEM photograph illustrating a profile of a metal layer obtained by a destructive method prior to being cleaned.
Figure 3B:
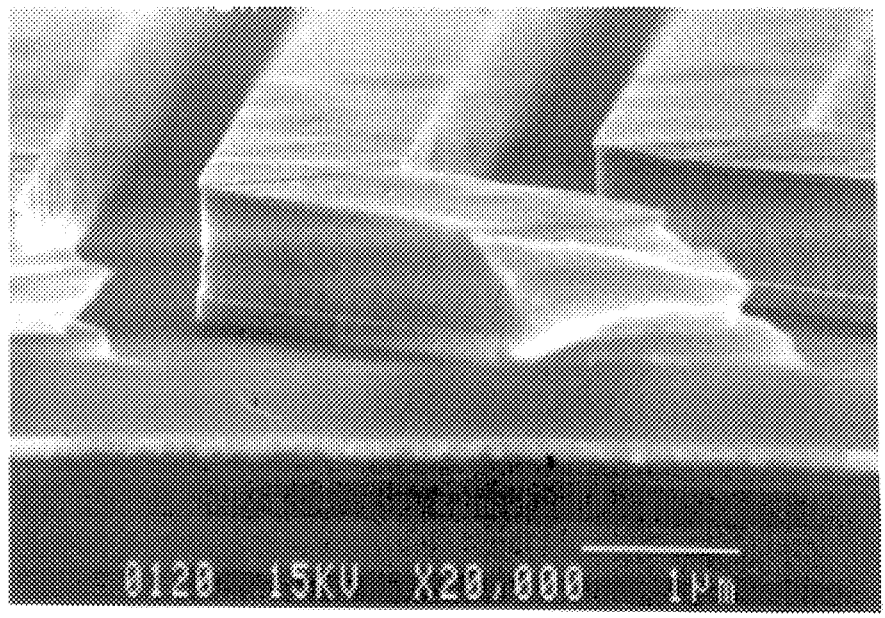
FIG. 3B is an SEM photograph illustrating a profile of a metal layer obtained by a destructive method after being cleaned with the cleaning solutions of the present invention.

The effect of using the cleaning solution of the present invention on the metal layer is demonstrated. FIG. 3A is an SEM photo showing a profile of an uncleaned metal layer obtained by a destructive method. FIG. 3B is an SEM photo showing a profile of the metal layer after being cleaned with a cleaning solution of the present invention. As can be seen, the cleaning solution effectively cleans the metal layer with minimal damage.

Figure 3C:
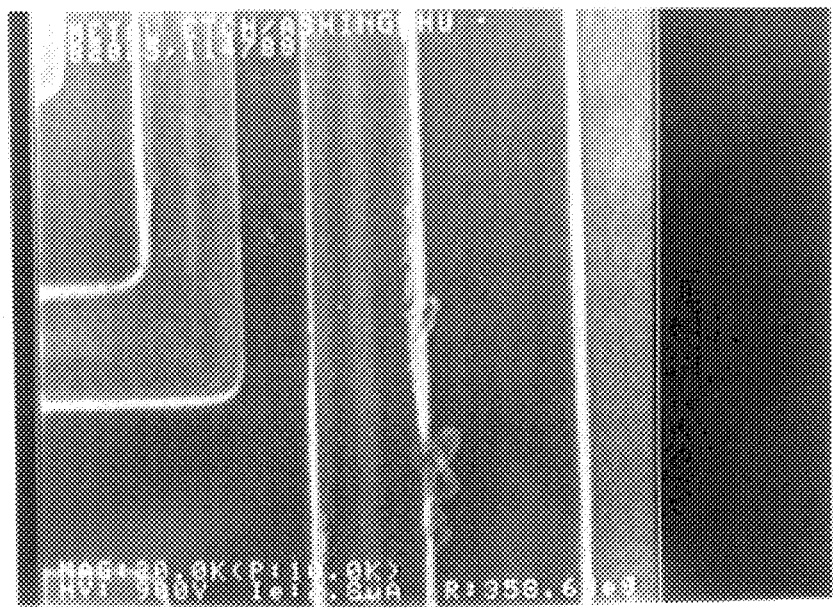
FIG. 3C is an SEM photograph illustrating a profile of a metal layer obtained by a non-destructive method prior to being cleaned.
Figure 3D:
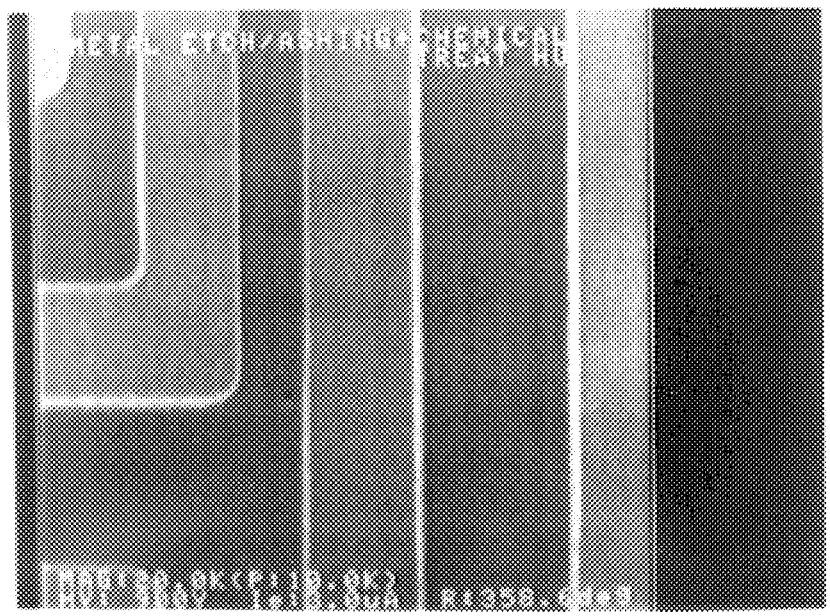
FIG. 3D is an SEM photograph illustrating a profile of a metal layer obtained by a non-destructive method after being cleaned with the cleaning solutions of the present invention.

FIG. 3C is an SEM photo showing a profile of an uncleaned metal layer obtained by a non-destructive method. FIG. 3D is an SEM photo showing a profile of the metal layer after being cleaned with a cleaning solution of the present invention. As can be seen, the cleaning solution effectively cleans the metal layer with minimal damage.

The cleaning solutions of the invention are highly advantageous. Impurities such as particles and polymer contaminants resulting from the formation of a metal wiring layer can be effectively removed without significant damage to the metal layer. As a result, a semiconductor device containing the metal layer is more reliable. Additionally, wiring shorts are reduced.

In the drawings, specification, and examples, there have been disclosed typical preferred embodiments of the invention and, although specific terms are employed, they are used in a generic and descriptive sense only and not for purposes of limitation, the scope of the invention being set forth in the following claims.

That which is claimed:

1. A method of removing an impurity from a semiconductor device, said method comprising:

treating the semiconductor device with a cleaning solution to remove the impurity from the semiconductor device; wherein the cleaning solution comprises tetramethyl ammonium hydroxide, acetic acid, and water and is devoid of surfactant; and wherein the impurity comprises particles resulting from the formation of a metal wiring layer on the semiconductor device.

2. A method according to claim 1, wherein the impurity further comprises polymer contaminants.

3. A method according to claim 1, wherein the water is deionized water.

4. A method according to claim 1, wherein the concentration of the tetramethyl ammonium hydroxide in the cleaning solution ranges from about 1 to about 30 weight percent.

5. A method according to claim 1, wherein the volume ratio of the acetic acid to the tetramethyl ammonium hydroxide in the cleaning solution ranges from about 1 to about 50.

6. A method according to claim 1, wherein the volume ratio of the water to the tetramethyl ammonium hydroxide in the cleaning solution ranges from about 1 to about 50.

* * * * *